United States Patent
Mueller et al.

(10) Patent No.: US 6,686,691 B1
(45) Date of Patent: Feb. 3, 2004

(54) TRI-COLOR, WHITE LIGHT LED LAMPS

(75) Inventors: Gerd O Mueller, San Jose, CA (US); Regina B Mueller-Mach, San Jose, CA (US); Christopher H Lowery, Fremont, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/405,947

(22) Filed: Sep. 27, 1999

(51) Int. Cl.$^7$ .................................................. H01J 1/62

(52) U.S. Cl. .................... 313/503; 313/498; 313/501; 252/301.65

(58) Field of Search ................................ 313/501, 502, 313/503, 506, 487, 495, 496, 498; 362/293; 257/100, 99; 252/301.63

(56) References Cited

U.S. PATENT DOCUMENTS

| | | | |
|---|---|---|---|
| 3,621,340 A | | 11/1971 | Singh et al. ............. 313/108 D |
| 3,819,974 A | | 6/1974 | Stevenson ............... 313/108 D |
| 4,275,333 A | * | 6/1981 | Kagami et al. ............ 313/495 |
| 4,303,913 A | | 12/1981 | Tohda et al. ............... 340/704 |
| 4,365,184 A | * | 12/1982 | Higton et al. ............. 313/503 |
| 4,377,769 A | * | 3/1983 | Beatty et al. ............. 313/495 |
| 4,563,297 A | | 1/1986 | Kukimoto et al. .... 252/301.4 R |
| 5,049,779 A | | 9/1991 | Itsuki et al. .............. 313/486 |
| 5,208,462 A | | 5/1993 | O'Connor et al. ....... 250/493.1 |

(List continued on next page.)

FOREIGN PATENT DOCUMENTS

| | | | |
|---|---|---|---|
| WO | WO 97/48138 | 12/1997 | ........... H01L/33/00 |
| WO | WO 97/50132 | 12/1997 | ........... H01L/33/00 |
| WO | WO 00/33389 | 6/2000 | ........... H01L/33/00 |
| WO | WO 00/33390 | 6/2000 | ........... H01L/33/00 |

OTHER PUBLICATIONS

A. Vecht, Development in Electroluminescent Panels, Sep. 1982, Journal of Crystal Growth, vol. 59, No. 1/2, pp 81–97.*

Yuichi Sato et al., "Full–Color Fluorescent Display Devices Using a Near–UV Light–Emitting Diode," *Japanese Journal of Applied Physics*, vol. 35 (1996), pp. L838–839, (Jul.).

Yoshimasa A. Ono et al., "White–light emitting thin film electroluminescent devices with stacked SrS:Ce/CaS:Eu active layers," *Journal of Applied Physics*, Dec. 1, (1989) No. 11, New York, US, (no month).

S. Tanaka et al., "Excitation Mechanism In White–Light Emitting SrS:Pr, K and SrS:Ce, K, Eu Thin–Film Electroluminescent Devices", Springer Proceedings in Physics, vol. 38, pp. 56–59, (1989) no month.

M. Pham–Thi et al., "Red Calcium Sulfide Phosphors For Visual Displays", SID 92 DIGEST, 1992, pp. 172–174, (no month).

(List continued on next page.)

*Primary Examiner*—Nimeshkumar D. Patel
*Assistant Examiner*—Karabi Guharay
(74) *Attorney, Agent, or Firm*—Patent Law Group LLP

(57) ABSTRACT

The present invention relates to a tri-color lamp for generating white light. In particular, the invention relates to a phosphor mixture comprising two phosphors having host sulfide materials that can absorb radiation emitted by a light emitting diode, particularly a blue LED. This arrangement provides a mixing of three light sources—light emitted from the two phosphors and unabsorbed light emitted from the LED. The phosphors can contain the same dopant, such as a rare earth ion, to allow matching of the phosphors in relation to the LED emitted radiation. Power fractions of each of the light sources can be varied to achieve good color rendering. The present invention also relates to an alternative to a green LED comprising a single green phosphor that absorbs radiation from a blue LED. A resulting device provides green light of high absorption efficiency and high luminous equivalent values.

32 Claims, 2 Drawing Sheets

U.S. PATENT DOCUMENTS

| | | | |
|---|---|---|---|
| 5,291,098 A | 3/1994 | Okita | 313/506 |
| 5,312,560 A | 5/1994 | Somatomo | 252/301.45 |
| 5,438,198 A | 8/1995 | Ebitani | 250/330 |
| 5,523,018 A | 6/1996 | Okada et al. | 252/301.4 P |
| 5,641,582 A * | 6/1997 | Nire et al. | 313/503 |
| 5,700,591 A | 12/1997 | Okajima | 428/690 |
| 5,811,924 A * | 9/1998 | Okumura et al. | 313/487 |
| 5,813,752 A | 9/1998 | Singer | 362/293 |
| 5,813,753 A | 9/1998 | Vriens | 362/293 |
| 5,847,507 A | 12/1998 | Butterworth et al. | 313/512 |
| 5,957,560 A | 9/1999 | Do et al. | 353/88 |
| 5,959,316 A | 9/1999 | Lowery | 257/98 |
| 5,998,925 A * | 12/1999 | Shimizu et al. | 313/503 |
| 6,153,123 A * | 11/2000 | Hampden-Smith et al. | 313/503 |
| 6,212,213 B1 | 4/2001 | Weber et al. | 372/50 |
| 6,229,338 B1 * | 5/2001 | Coulman et al. | 362/293 |
| 6,234,648 B1 * | 5/2001 | Borner et al. | 362/235 |
| 6,252,254 B1 * | 6/2001 | Soules et al. | 313/501 |
| 6,255,670 B1 | 7/2001 | Srivastava et al. | 257/89 |
| 6,273,589 B1 * | 8/2001 | Weber et al. | 362/293 |
| 6,294,800 B1 | 9/2001 | Duggal et al. | 257/89 |
| 6,351,069 B1 | 2/2002 | Lowery et al. | 313/512 |

OTHER PUBLICATIONS

Zhilin Zhang, et al., "The Relation Of Thin Film Electroluminescence And Photoluminescence Excitation Spectra", Springer Proceedings in Physics, vol. 38, pp. 105–108, (1989) no month.

P. Benalloul et al., "$IIA-III_2-S_4$ Ternaly Compounds: New Host Matrices For Full Color Thin film Electroluminescence Displays", Appl. Phys. Lett., pp. 1954–1956, (no month).

T. E. Peters et al., "Luminescence And Structural Properties Of Thiogallate Phosphors $Ce^{+3}$ And $Eu^{+2}$–Activated Phosphors. Part I", J. Electrochem. Soc.: Solid–State Science and Technology, Feb. 1972, pp. 230–236.

K. T. Le Thi et al., "Investigation Of The $MS-Al_2S_3$ Systems (M=Ca, Sr, Ba) And Luminescence Properties Of Europium–Doped Thioaluminates", Materials Science and Engineering, B14 1992, pp. 393–397.

M. R. Davolos et al., "Luminescence Of $Eu^{2+}$ In Strontium And Barium Thiogallates", Journal of Solid State Chemistry 83, 1989, pp. 316–323, (no month).

P. Bénalloul, C. Barthou, J. Benoit, $SrGa_2S_4$: RE phosphors for full colour electroluminescent displays:, Journal of Alloys and Compounds 275–277 (1998), pp. 709–715, (no month).

Copy of co–pending application Ser. No. 09/827,382, filed Apr. 4, 2001, 30 pages.

Copy of co–pending application Ser. No. 09/887,954, filed Jun. 22, 2001, 11 pages.

Shosaku Tanaka, "Thin–Film Electroluminescent Devices Using CaS And SrS," *Journal of Crystal Growth*, Apr. 1, (1990), No. 1/4, Amsterdam, NL, pp. 958–966.

Shosaku Tanaka et al., "Bright White–Light EL Devices With New Phosphor Thin Films Based On SrS," *Proceedings of the SID*, (1988) No. 4, New York, US, (6 pages), (no month).

Shinji Okamoto, "White–Emitting Thin–Film Electroluminescence Devices with SrS Phosphor Doubly Activated with Rare–Earth Ions," *Japanese Journal of Applied Physics*, vol. 29, No. 10, Oct., 1990, pp. 1987–1990.

Yasuhiro Nakao, "Luminescence Centers Of MgS, CaS and CaSe Phosphors Activated With $Eu^{2+}$ Ion", Journal of the Physical Society of Japan, vol. 48, No. 2, Feb., 1980, pp. 534–541.

* cited by examiner

TRI-COLOR, WHITE LIGHT LED LAMPS

FIELD OF INVENTION

The present invention relates to a tri-color lamp. The lamp comprises a mixture of two phosphors and a light emitting diode for an excitation energy source. In particular, the lamp employs a blue LED and a mixture of red and green phosphors for the production of white light.

BACKGROUND OF THE INVENTION

There is an ongoing need to generate new phosphor compositions to improve efficiency and color quality in luminescent devices, particularly in the production of white light. Phosphors are luminescent materials that can absorb an excitation energy (usually radiation energy) and store this energy for a period of time. The stored energy is then emitted as radiation of a different energy than the initial excitation energy. For example, "down-conversion" refers to a situation where the emitted radiation has less quantum energy than the initial excitation radiation. Thus, the energy wavelength effectively increases, and this increase is termed a "Stokes shift." "Up-conversion" refers to a situation where the emitted radiation has greater quantum energy than the excitation radiation ("Anti-Stokes shift").

Improvements in efficiency and color quality in phosphor-based devices are constantly being developed. "Efficiency" relates to a fraction of photons emitted with respect to a number of photons initially provided as excitation energy. Inefficient conversion results when at least a portion of the energy is consumed by non-radiative processes. Color "quality" can be measured by a number of different rating systems. "Chromaticity" defines color by hue and saturation. "CIE" is a chromaticity coordinate system developed by Commission Internationale de l'Eclairage (international commission on illumination). The CIE Chromaticity Coordinates are coordinates that define a color in "1931 CIE" color space. These coordinates are defined as x, y, z and are ratios of the three standard primary colors, X, Y, Z (tristimulus values), in relation to the sum of the three tristimulus values. A CIE chart contains a plot of the x, y and z ratios of the tristimulus values versus their sum. In the situation where the reduced coordinates x, y, z add to 1, typically, a two-dimensional CIE (x, y) plot is used.

White-like colors can be described by a "correlated color temperature" (CCT). For example, when a metal is heated, a resulting light is emitted which initially glows as a red color. As the metal is heated to increasingly higher temperatures, the emitted light shifts to higher quantum energies, beginning with reddish light and shifting to white light and ultimately to a bluish-white light. A system was developed to determine these color changes on a standard object known as a blackbody radiator. Depending on the temperature, the blackbody radiator will emit white-like radiation. The color of this white-like radiation can then be described in the CIE chromaticity chart. Thus, the correlated color temperature of a light source to be evaluated is the temperature at which the blackbody radiator produces the chromaticity most similar to that of the light source. Color temperature and CCT are expressed in degrees Kelvin.

A "color rendering index" (CRI) is established by a visual experiment. The correlated color temperature of a light source to be evaluated is determined. Then eight standard color samples are illuminated first by the light source and then by a light from a blackbody having the same color temperature. If a standard color sample does not change color, then the light source has a theoretically perfect special CRI value of 100. A general color rendering index is termed "Ra", which is an average of the CRIs of all eight standard color samples.

Older white lamps involved emission of light over a broad wavelength range. It was then discovered that a white-like color can be simulated by a mixture of two or three different light colors, where each emission comprised a relatively narrow wavelength range. These lamps afforded more control to manipulate the white color because emissive properties (emission energy and intensity) of the individual red, green and blue light sources can be individually tailored. This method thus provided the possibility of achieving improved color rendering properties.

An example of a two-color lamp comprises one phosphor and an excitation energy source. Light emitted by the phosphor combines with unabsorbed light from the excitation source to produce a white-like color. Further improvements in fluorescent lamps involved three different light colors (i.e. a tri-color lamp) resulting in white light at higher efficiencies. One example of a tri-color lamp involved blue, red and green light-emitting phosphors. Other previous tri-color lamps comprised a combination of light from two phosphors (a green and red phosphor) and unabsorbed light from a mercury plasma excitation source.

Previous tri-color lamps involving a mercury plasma excitation source, however, suffer many disadvantages including: (1) a need for high voltages which can result in gaseous discharge with energetic ions; (2) emission of high energy UV quanta; and (3) correspondingly low lifetimes. Thus, there is an ongoing need for devices that overcome these deficiencies.

Finally there remains a continued challenge to uncover phosphor compositions and mixtures of these compositions to provide improved properties, including improved efficiency, color rendering (e.g. as measured by high color rendering indices) and luminance (intensity), particularly in a tri-color, white lamp.

SUMMARY OF THE INVENTION

One aspect of the present invention provides a composition comprising a mixture of a first phosphor and a second phosphor. Each phosphor comprises a host sulfide material and a rare earth dopant and each phosphor is capable of being excited by a common light emitting diode.

Another aspect of the present invention provides a composition comprising a mixture of a first phosphor and a second phosphor. Each phosphor comprises a host material and a rare earth dopant. The first phosphor is capable of being excited by a light emitting diode and the second phosphor is capable of being excited by an emission of the first phosphor.

Another aspect of the present invention provides a device comprising a light emitting diode, for emitting a pattern of light. The device further comprises a composition comprising a mixture of a first phosphor and a second phosphor. Each phosphor comprises a host sulfide material and a rare earth dopant and the composition is positioned in the light pattern.

Another aspect of the present invention provides a device comprising a green phosphor and a blue light emitting diode, for providing an excitation radiation to the phosphor.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION

Figure 1:
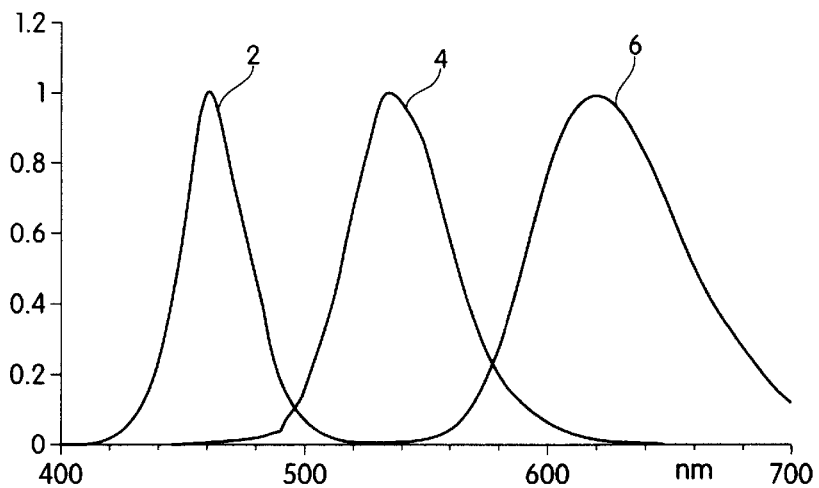
FIG. 1 shows an overlay of normalized spectra of $SrGa_2S_4$:Eu and SrS:Eu upon excitation by a blue LED at 460 nm.

The invention relates, in part, to the discovery that a tri-color lamp employing specific red and green phosphors excitable by a common light emitting diode (LED) can achieve white light at higher efficiencies with superior color rendering over previous fluorescent lamps.

One aspect of the present invention provides a composition comprising a mixture of a first phosphor and a second phosphor, each phosphor capable of being excited by a common light emitting diode, i.e. only one light emitting diode is used to excite both phosphors, as opposed to each phosphor requiring a separate energy source.

An advantageous feature of the present invention involves the use of an LED as an excitation source. An LED has a p-n junction between doped semiconductor regions. Upon application of a current, there can exist sufficient energy to allow electrons and holes to cross the p-n junction such that a resulting recombination of electrons and holes cause emission of radiation. Advantages of LEDs over other excitation energy sources include small size, low power consumption, long lifetimes and low amounts of thermal energy emitted. In addition, LEDs have small dimensions that allow miniaturization of devices.

In one embodiment, the common LED is a blue LED. The use of blue light as an excitation radiation over other light sources has been found to be particularly advantageous in that conversion efficiency to visible light is higher. In one embodiment, each phosphor is capable of being excited by a common LED which emits radiation at a wavelength from about 450 nm to about 480 nm. It has been found that color rendering can decrease at excitation energies below 450 nm whereas absorption by the phosphors decreases at excitation energies greater than 480 nm. An example of a blue LED that emits radiation in the above-mentioned energy ranges is a (In,Ga)N diode.

A blue light source can provide inherent advantages over UV excitation sources in that power efficiency is increased for red and green phosphors excited by blue light. The present phosphor materials generally require lesser Stokes shifts than phosphors of the previous devices. For example, certain tri-color prior art fluorescent lamps incorporate mercury plasmas which provide a UV emission centered at approximately 4.9 eV. This UV light excites blue, red and green phosphors such that resulting emission spectra show maximum intensities at energies of approximately 2.8 eV (unabsorbed light), 2.3 eV (green) and 2.0 eV (red) respectively. Significant Stokes shifts are obviously involved in this situation. Power efficiency, however, is limited by quantum deficit, which is the difference of the quantum energies of exciting and emitted quanta. Thus, for the example described above, power efficiency of the green light is, on average, (4.9 eV−2.3 eV)/4.9 eV=53%. In contrast, green (2.3 eV) and red (2.0) phosphors excited by a blue LED with an emission of about 2.7 eV (~460 nm) exhibit smaller Stokes shifts and quantum deficits, and accordingly power efficiency is greater.

Phosphors comprise host materials and dopant ions. Typically, the host material has an inorganic, ionic lattice structure (a "host lattice") in which the dopant ion replaces a lattice ion. The dopant is capable of emitting light upon absorbing excitation radiation. Ideal dopants strongly absorb excitation radiation and efficiently convert this energy into emitted radiation. In one embodiment, the dopant is a rare earth ion. Rare earth ions absorb and emit radiation via $4f-4f$ transitions, i.e. electronic transitions involving f-orbital energy levels. While f—f transitions are quantum-mechanically forbidden, resulting in weak emission intensities, it is known that certain rare earth ions, such as $Eu^{2+}$ or $Ce^{3+}$, strongly absorb radiation through allowed $4f-5df$ transitions (via d-orbital/f-orbital mixing) and consequently produce high emission intensities.

The emissions of certain dopants can be shifted in energy depending on the host lattice in which the dopant ion resides. Thus, this aspect of the invention lies, in part, in the discovery that certain rare earth dopants efficiently convert blue light to visible light when incorporated into an appropriate host material. In one embodiment, the first and second phosphors comprise a host sulfide material, i.e. a lattice which includes sulfide ions. Preferred host sulfide materials include CaS, SrS and a thiogallates such as $SrGa_2S_4$.

Another advantageous feature of the present invention is to provide a phosphor mixture excitable by one common blue energy source of a relatively narrow linewidth, to emit light at two different energy ranges (e.g. red and green). Strategies to provide appropriate phosphors are disclosed here. In one embodiment, the dopant is the same in the first and second phosphor. The red and green emissions of the two phosphors can be tuned by selecting an appropriate host material. In one embodiment, the green phosphor is $SrGa_2S_4$:Eu. In another embodiment, the red phosphor is selected from the group consisting of SrS:Eu and CaS:Eu.

FIG. 1 is an overlay of emission spectra from two different phosphors having the same dopant capable of being excited by one common (In,Ga)N LED at 460 nm. The phosphors are provided as a mixture in an encapsulant. The spectra have been normalized to an intensity of 1. Spectrum 2 corresponds to an emission of the blue LED with a maximum intensity at ~460 nm, spectrum 4 corresponds to an emission from a green phosphor material, $SrGa_2S_4$:Eu with a maximum intensity at ~520 nm, and spectrum 6 corresponds to an emission from a red phosphor material, SrS:Eu with a maximum intensity at ~620 nm.

Alternatively, the first and second phosphors can have different dopants. The same host material can be used, or the first and second phosphors can have different host materials. One of ordinary skill in the art can screen potential phosphor candidates by selecting phosphors that can be excited by radiation between about 450 nm and about 480, and observing whether they emit red or green light.

In one embodiment, the amount of dopant present in the host lattice is from about 0.1 mol % to about 8 mol %.

Preferred amounts of dopant may depend on the type of host lattice. For example, a dopant concentration in $SrGa_2S_4$ is preferably from about 2 mol % to about 4 mol %, whereas a dopant concentration in SrS is preferably from about 0.3 mol % to about 0.8 mol %.

The present invention also relates to another tri-color system, in which a first phosphor is excited by an LED source, and the emission of the first phosphor is capable of exciting a second phosphor. Thus, another aspect of the present invention provides a mixture of a first phosphor and a second phosphor, each phosphor comprising a host material and a rare earth dopant. The first phosphor is capable of being excited by a light emitting diode and the second phosphor is capable of being excited by an emission of the first phosphor. In one embodiment, the LED is a blue LED. The first phosphor can be a green phosphor with an emission capable of exciting a red phosphor (second phosphor). This aspect allows the use of only one LED source in the event that only one phosphor is capable of being excited by the LED.

Another aspect of the present invention provides a device comprising a phosphor mixture, as described previously, and a light emitting diode. The LED emits a local light pattern, the pattern defining either a volume or an area of light. A composition comprising a mixture of a first phosphor and a second phosphor is positioned in the light pattern. Each phosphor comprises a host sulfide material and a rare earth dopant, having compositions and concentrations as described previously. This arrangement allows light emitted from the LED to: (1) be absorbed by the composition; and (2) mix effectively with light emitted from the phosphor mixture such that good homogeneity of color rendering is achieved. This arrangement eliminates unwanted "demixing" of the various light sources. Demixing occurs when separate fractions of radiation are emitted from the device due to the LED and the phosphor mixture, i.e. there is minimal mixing of the different light components.

In one embodiment, the device is a lamp. In one embodiment, the lamp emits white light. In this embodiment, the first phosphor is a green phosphor and the second phosphor is a red phosphor, where the white color is achieved by effectively mixing the green and red light with unabsorbed blue light provided by the LED. In one embodiment, the lamp containing the phosphor mixture comprises a 5 mm LED lamp design of Hewlett-Packard.

The white light lamp of the present invention is particularly advantageous in that the color rendering properties are far superior than those of any previous white lamps. In one embodiment, the lamp is capable of emitting radiation having a color rendering index, Ra of at least about 60 at a color temperature from about 2700 K to about 8000 K, preferably an Ra of at least about 70, more preferably an Ra of at least about 80 and even more preferably an Ra of at least about 90. In a preferred embodiment, the lamp generates a CRI, Ra of greater than 70 for CCT values of less than 6000 K.

Figure 2:
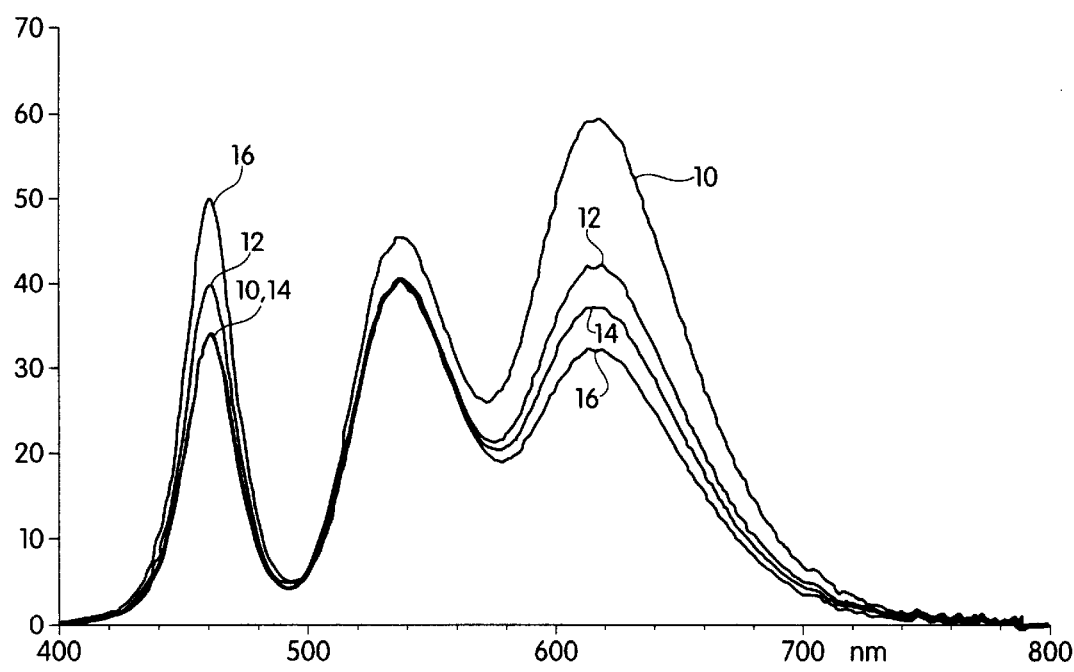
FIG. 2 shows a simulation of spectra of a mixture of $SrGa_2S_4$:Eu and SrS:Eu upon excitation by a blue LED at 460 nm at different color temperatures.

FIG. 2 shows a simulation of emission spectra of a tri-color lamp comprising a mixture of $SrGa_2S_4$:Eu and SrS:Eu phosphors excited by a blue (In,Ga)N LED at 460 nm. Emission intensity or radiance is indicated in the ordinate axis. This system exhibits superior color rendering properties over a wide range of color temperatures. Spectrum 10 (3000 K), spectrum 12 (3800 K) and spectrum 14 (4400 K) each correspond to an Ra of 94 whereas spectrum 16 (4900 K) corresponds to an Ra of 92. Ra values of greater than 90 for white LEDs have not been previously observed.

It is a feature of the present invention to mix respective amounts of the phosphors and to illuminate these phosphors with a blue LED to closely match these desired simulated spectra.

By varying optical properties of each source of light in the device, the device can be designed to have desired characteristics depending on a particular application. For example, certain devices may be required to generate light of high intensity and only adequate color rendering is needed, whereas other applications may require high color rendering properties, at the expense of efficiency. Alternatively, color rendering can be sacrificed for higher efficiency. For example, a 50% increase in efficiency can be achieved by decreasing Ra down to about 60. Such properties can be varied by changing relative power fractions of each light source. A "power fraction" is the fraction of light from each source that provides the final light color. Power fractions can be varied by, for example, changing a relative amount of phosphor material present in the device, varying dopant concentration or changing the host lattice or dopant.

It is understood that the phosphor mixture can comprise more than two phosphors, so long as optimal color rendering properties are achieved.

In one embodiment, the device further comprises a polymer for encapsulating the phosphor composition. In this embodiment, the phosphor mixture should exhibit high stability properties in the encapsulant. Preferably, the polymer is optically clear to prevent significant light scattering. In one embodiment, the polymer is selected from the group consisting of epoxy and silicone. A variety of polymers are known in the LED industry for making 5 mm LED lamps. Encapsulation can be performed by adding the phosphor mixture to a liquid that is a polymer precursor. For example, the phosphor mixture can be a powder. Introducing phosphor particles into a polymer precursor liquid results in formation of a slurry (i.e. a suspension of particles). Upon polymerization, the phosphor mixture is fixed rigidly in place by the encapsulation. In one embodiment, both the composition and the LED are encapsulated in the polymer.

Although the role of phosphor grain size (mean diameter of phosphor particles) is not completely understood, weight fractions may change depending on a particular grain size. Preferably, grain sizes are less than about 15 $\mu$m, and more preferably, less than about 12 $\mu$m, to avoid clogging of devices which dispose the phosphors. In one embodiment, the grain size of each phosphor type varies. In certain specific embodiments, the grain size of $SrGa_2S_4$:Eu is less than about 10 $\mu$m and the grain size of SrS:Eu is less than about 12 $\mu$m. Other devices, however, can be prepared with larger grain sizes.

Although unabsorbed light emitted from the LED contributes to color rendering, unabsorbed light can sometimes escape without mixing with light emitted from the phosphors, resulting in a reduced overall efficiency of the device. Thus, in one embodiment, the LED and composition are positioned within a reflector cup. A reflector cup can be any depression or recess prepared from a reflecting material. By positioning the LED and phosphor particles in a reflector cup, unabsorbed/unmixed LED-emitted light can be reflected either back to the phosphor particles to eventually be absorbed, or mixed with light emitted from the phosphors.

Figure 3:
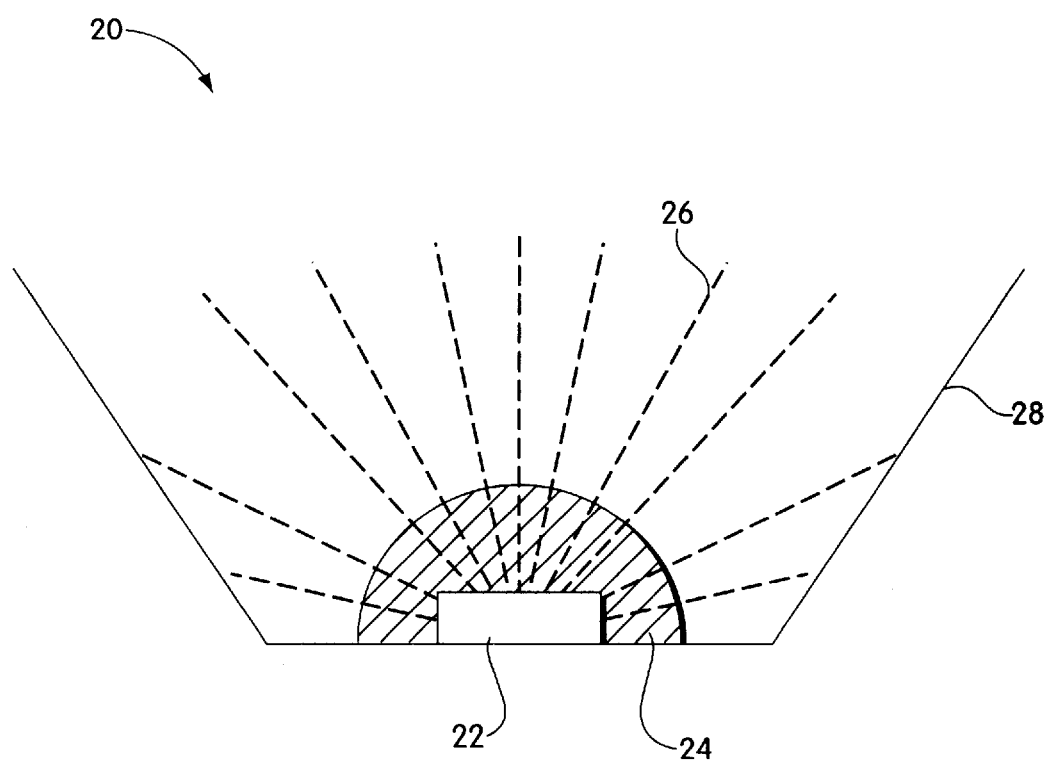
FIG. 3 shows a schematic of a tri-color lamp comprising a two-phosphor mixture positioned in a pathway of light emitted by an LED.

FIG. 3 shows a schematic of the device of the present invention. Lamp 20 comprises LED 22. LED 22 is positioned in a reflector cup 28. LED 22 emits light in a pattern indicated by lines 26. A phosphor mixture 24 is positioned in the pattern 26. It can be seen that some unabsorbed light emitted by LED 22 can reflect from walls of reflector cup 28 and back to phosphor mixture 24. In this example, reflector cup 28 can modify light pattern 26 if light is reflected into a space not previously covered by the initial light pattern (e.g. in the case of a parabolic reflector). It is understood that one of ordinary skill in the art can provide reflector cup 28 in any shape that optimizes reflection of light back to mixture 24, or optimizes positioning of LED 22 to provide a light pattern for efficient conversion. For example, the walls of reflector cup 28 can be parabolic.

Another aspect of the present invention provides an alternative design to a green LED. Green LEDs have been developed only recently. Current green LEDs, however, are notoriously more inefficient than blue LEDs. In addition, emitted radiation from green LEDs exhibits wavelength shifts with an increase in temperature, which is an undesired characteristic.

Thus, this aspect of the present invention provides a device comprising a green phosphor and a blue light emitting diode, for providing an excitation radiation to the phosphor. By taking advantage of down-conversion, the blue light can be converted to green light via the green phosphor. This device is comparable to a green LED yet eliminates the disadvantages of green LEDs, such as providing comparable efficiencies to blue LEDs and minimizing radiation energy shifts with increasing temperature. In one embodiment, the green phosphor is $SrGa_2S_4$:Eu. High luminous equivalents values of ~575 lm/W can be achieved with this phosphor at a maximum wavelength of about 535 nm, which is far superior to any other green LED or alternative. High absorption of excitation radiation is preferred to eliminate a significant amount of blue LED radiation which may spoil efficiency and/or color saturation.

The function and advantage of these and other embodiments of the present invention will be more fully understood from the examples below. The following examples are intended to illustrate the benefits of the present invention, but do not exemplify the full scope of the invention.

In a first embodiment, a mixture comprising a first phosphor, $SrGa_2S_4$:Eu, and a second phosphor SrS:Eu was prepared. $SrGa_2S_4$ was produced by the method of P. Bernalloul, et al., J. Alloys Compounds 227 (1998), 709, and references cited therein.

The powders of the two phosphors are stirred in weighted amounts, which correspond to the desired power fractions of the three colors, into a liquid polymer precursor. A preferred polymer precursor is a standard precursor for 5 mm LED lamps, 'Hysol ST'.

EXAMPLE 2

Adjusting Power Fractions

This example illustrates a method for adjusting power fractions at desired correlated different color temperatures, and these power fractions are listed in Table 1. Starting from known or measured spectra of a (In,Ga)N LED, the green ($SrGa_2S_4$:Eu) and the red (SrS:Eu) emitting phosphor, a first approximation is made about respective power fractions of each color to obtain a desired spectrum that will result in optimal CCT/CRI values. This is achieved typically by performing a best estimate of the respective weights of the two phosphors. The mixture is then prepared and the mixture is illuminated with the LED. In this example, the wavelength of radiation is 460 nm. A trial spectrum is then obtained.

If the first trial spectrum does not achieve the CCT/CRI values of the desired spectrum, small amounts of the appropriate phosphors can be added and a new trial spectrum can be obtained. This step is repeated until the trial spectrum closely matches the desired spectrum.

Table 1 is generated by adding spectra of the three components: the LED, $SrGa_2S_4$:Eu, and SrS:Eu, with respective coefficients which correspond tot he power fractions. A composite spectrum is then obtained. The composite spectrum is evaluated using CIE recommended software (e.g. CIE 13.3-1995) for calculating CCT and CRI values. By this procedure, the desired CCT/CRI is converted into a desired spectrum. If CCT and Ra do not agree with the expectation within acceptable tolerances, a second iteration is performed to modify the power fractions in a systematical way. Subsequent iterations can be accomplished by numerical optimization, e.g. Simplex or Variable Metric Method can be used for automating the procedure.

Table 1 shows example power fractions for the phosphor mixture of Example 1.

TABLE 1

| Color Temperature (K) | $SrGa_2S_4$:Eu (green) | SrS:Eu (red) | LED (blue) |
| --- | --- | --- | --- |
| 2700 | 28 | 61 | 11 |
| 3000 | 32 | 55 | 13 |
| 4000 | 34 | 45 | 21 |
| 5000 | 35 | 39 | 26 |
| 6400 | 37 | 31 | 32 |
| 8000 | 34 | 29 | 37 |

The luminous equivalent of the resulting emitted light is about 310 (±4) lm/W.

EXAMPLE 3

5 mm LED LAMP

An example of a lamp of the present invention is described here. An Hysol ST slurry comprising a phosphor mixture of 7.6 wt % of $SrGa_2S_4$:Eu and 10.4 wt % SrS:Eu was positioned in a reflector cup in a 5 mm lamp design of Hewlett-Packard. The average particle size of $SrGa_2S_4$:Eu was about 9 µm and the average particle size of SrS:Eu was about 11.5 µm. Using a blue (In,Ga)N LED with an excitation radiation of 460 nm, a CCT of 4000K and a CRY of 91 was achieved.

Those skilled in the art would readily appreciate that all parameters listed herein are meant to be examples and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed:

1. A device comprising:
   a light emitting diode, for emitting a pattern of light; and
   a composition comprising a mixture of a first phosphor and a second phosphor, each phosphor comprising a host sulfide material and a rare earth dopant, the composition being positioned in the light pattern.
2. The device of claim 1, wherein the dopant is selected from the group consisting of $Eu^{2+}$ and $Ce^{3+}$.
3. The device of claim 2, wherein the dopant is the same in the first and second phosphor.
4. The device of claim 3, wherein the dopant is $Eu^{2+}$.
5. The device of claim 3, wherein the dopant is $Ce^{3+}$.

6. The device of claim 5, wherein the first phosphor is $SrGa_2S_4$:Ce.

7. The device of claim 5, wherein the second phosphor is CaS:Ce.

8. The device of claim 3, wherein the dopant is present in a concentration from about 0.1 mol % to about 8 mol %.

9. The device of claim 8, wherein the first phosphor comprises a $SrGa_2S_4$ host material and the dopant is present in a concentration from about 2 mol % to about 4 mol %.

10. The device of claim 9, wherein the second phosphor comprises a SrS host material and the dopant is present in a concentration from about 0.3 mol % to about 0.8 mol %.

11. The device of claim 1, wherein the sulfide is selected from the group consisting of CaS, SrS and a thiogallate.

12. The device of claim 11, wherein the thiogallate is $Sra_2S_4$.

13. The device of claim 1, wherein the first phosphor is capable of being excited by a light emitting diode and the second phosphor is capable of being excited by an emission of the first phosphor.

14. The device of claim 13, wherein each phosphor is capable of being excited by a blue light emitting diode.

15. The device of claim 14, wherein the first phosphor is a green phosphor and the second phosphor is a red phosphor.

16. The device of claim 1, wherein the light emitting diode has an emission at a wavelength from about 450 nm to about 480 nm.

17. The device of claim 16, wherein the device is a lamp.

18. The device of claim 17, wherein the lamp is a white light lamp.

19. The device of claim 18, wherein the lamp is capable of emitting radiation having a color rendering index, Ra of at least about 70 at a color temperature from about 2700 K to about 8000 K.

20. The device of claim 18, wherein the lamp is capable of emitting radiation having a color rendering index, Ra of at least about 80 at a color temperature from about 2700 K to about 8000 K.

21. The device of claim 18, wherein the lamp is capable of emitting radiation having a color rendering index, Ra of at least about 90 at a color temperature from about 2700 K to about 8000 K.

22. The device of claim 1, wherein the first phosphor is a green phosphor and the second phosphor is a red phosphor.

23. The device of claim 22, wherein the first phosphor is $SrGa_2S_4$:Eu.

24. The device of claim 22, wherein the second phosphor is selected from the group consisting of SrS:Eu and CaS:Eu.

25. A light emitting device comprising:
    a light emitting semiconductor device emitting a first light; and
    a mixture capable of converting said first light into composite light, said mixture comprising a first phosphor capable of converting said first light from said light emitting semiconductor device into a second light having a second peak in a second spectral range, and a second phosphor capable of converting said first light from the light emitting semiconductor device into a third light having a third peak in a red spectral range; and
    means for directing said composite light comprising said first light, said second light, and said third light in a predetermined direction.

26. The device of claim 25, wherein the first phosphor is a green phosphor and the second phosphor is a red phosphor.

27. The device of claim 26, wherein the first phosphor is $SrGa_2S_4$:Eu.

28. The device of claim 26, wherein the second phosphor is selected from the group consisting of SrS:Eu and CaS:Eu.

29. The device of claim 25, wherein the light emitting semiconductor device is a blue light emitting diode.

30. The device of claim 29, wherein each phosphor is capable of being excited by radiation at a wavelength from about 450 nm to about 480 nm.

31. The light emitting device of claim 25 wherein the second phosphor comprises CaS.

32. The light emitting device of claim 25 wherein the second phosphor comprises SrS.

* * * * *